United States Patent
Lu

(10) Patent No.: US 12,506,122 B2
(45) Date of Patent: Dec. 23, 2025

(54) METHOD FOR MIXING LED DIES FOR FORMING LIGHTING ARRAY

(71) Applicant: SAULTECH TECHNOLOGY CO., LTD., Hsinchu County (TW)

(72) Inventor: Hsiao-Kuang Lu, Zhubei (TW)

(73) Assignee: SAULTECH TECHNOLOGY CO., LTD., Hsinchu County (CN)

( * ) Notice: Subject to any disclaimer, the term of this patent is extended or adjusted under 35 U.S.C. 154(b) by 384 days.

(21) Appl. No.: 18/235,389

(22) Filed: Aug. 18, 2023

(65) Prior Publication Data

US 2025/0062291 A1   Feb. 20, 2025

(51) Int. Cl.
H10H 29/14 (2025.01)
H01L 25/075 (2006.01)

(52) U.S. Cl.
CPC ....... *H01L 25/0753* (2013.01); *H10H 29/142* (2025.01)

(58) Field of Classification Search
CPC . H01L 25/075; H01L 25/0753; H10H 29/142; H10H 29/24; H10H 29/20
See application file for complete search history.

(56) References Cited

U.S. PATENT DOCUMENTS

| | | | |
|---|---|---|---|
| 7,235,817 B2 * | 6/2007 | Yano | H10H 20/8516 257/E33.059 |
| 7,321,137 B2 * | 1/2008 | Park | H01L 25/0753 257/E25.02 |
| 7,737,636 B2 * | 6/2010 | Li | H10H 20/853 313/498 |
| 8,440,500 B2 * | 5/2013 | Su | H01L 25/0753 438/26 |
| 8,486,761 B2 * | 7/2013 | Bierhuizen | H01L 25/0753 438/7 |
| 9,691,949 B2 * | 6/2017 | Reiherzer | H01L 25/0753 |
| 11,024,610 B2 * | 6/2021 | Schwarz | H01L 25/0753 |
| 11,355,548 B2 * | 6/2022 | Hin | H01L 25/0753 |
| 2008/0123021 A1 * | 5/2008 | Park | H01L 25/075 349/67 |
| 2013/0328088 A1 * | 12/2013 | Morikawa | H10H 20/853 257/98 |
| 2015/0263246 A1 * | 9/2015 | Hiramatsu | F21K 9/232 438/27 |
| 2023/0105078 A1 * | 4/2023 | Hsieh | H01L 25/0753 438/22 |
| 2024/0405054 A1 * | 12/2024 | Hsieh | H01L 25/0753 |

* cited by examiner

Primary Examiner — Ismael Negron

(57) ABSTRACT

A method including the following steps: establishing a matrix with i rows and j columns which includes i×j elements, where each element in the matrix is a square matrix with n rows and n columns, wherein i≥2, j≥2, n≥3, and i, j, n are all positive integers; using a magic square to label the numbers 1, 2, . . . , $n^2$, on $n^2$ coordinates of each square matrix respectively, so that a sum of the numbers labeled on n coordinates of each row, column, and both diagonals of each square matrix is equal to $$\frac{n(n^2+1)}{2};$$

dividing a plurality of LED dies into $n^2$ wavelength segments by wavelength, with each wavelength segment having i×j LED dies; and placing the i×j LED dies of the same wavelength segment on the coordinates labeled with the same number in the square matrix.

10 Claims, 13 Drawing Sheets

METHOD FOR MIXING LED DIES FOR FORMING LIGHTING ARRAY

BACKGROUND OF THE INVENTION

1. Field of the Invention

The present invention relates generally to a method for mixing light-emitting diode (LED) dies.

2. The Prior Arts

A light-emitting diode (LED) display is a display using light-emitting diodes, including a plurality of LED light boxes. Each LED light box includes a plurality of LED printed circuit boards. Each LED printed circuit board comprises a plurality of discretely packaged LED dies.

The known method of mixing LED dies is to use vibration to randomly combine or sort different types of LED dies (red light, blue light, and green light). Therefore, the average wavelength of the plurality of LED printed circuit boards will be consistent, that is to say, the colors among the plurality of LED printed circuit boards are uniform.

However, the small area inside a single LED printed circuit board has the problem of inconsistent average wavelengths, resulting in uneven color of a single LED printed circuit board.

Moreover, the LED dies are easily collided and damaged due to vibration and mixing.

SUMMARY OF THE INVENTION

A primary objective of the present invention is to provide a method for mixing LED dies, which can allocate different types of LED dies (red light, blue light, and green light) to positions by using a magic square to match wavelength segments.

In order to achieve the aforementioned objective, the present invention provides a method for mixing LED dies, comprising the following steps:
(a) creating a matrix with i columns and j rows, the matrix comprising i×j elements, wherein each element in the matrix is a square matrix with n columns and n rows, where i≥2, j≥2, n≥3, and i, j, n are all positive integers;
(b) using the magic square to mark the numbers 1, 2, . . . , $n^2$ on the $n^2$ coordinates of each square matrix, so that the sum of the numbers marked on the n coordinates of each row, column, and two diagonals of each square matrix is equal to $$\frac{n(n^2+1)}{2};$$

(c) dividing the plurality of LED dies into $n^2$ wavelength segments according to wavelength, and each wavelength segment containing i×j LED dies; and
(d) placing the i×j LED dies in the same wavelength segment on the coordinates marked with the same numbers in the square matrices.

In some embodiments, the magic square is an odd-order magic square.

In some embodiments, n=3.

In some embodiments, the magic square is an even-order magic square.

In some embodiments, step (b) further includes: the sum of numbers marked on the n consecutive coordinates on any diagonal line of two adjacent square matrices is equal to $$\frac{n(n^2+1)}{2}.$$

In some embodiments, step (b) further includes: the sum of the numbers marked on the coordinates of any 2×2 inner square matrix in each square matrix is equal to $2(n^2+1)$, and the sum of the numbers marked on the two coordinates whose distance from any diagonal line of each square matrix is $$\frac{n}{2}$$

coordinate units is equal to $n^2+1$, and the side length of the matrix is a coordinate unit that is a multiple of 4.

In some embodiments, step (b) further includes: the sum of numbers marked on the n consecutive coordinates on any diagonal line of two adjacent square matrices is equal to $$\frac{n(n^2+1)}{2},$$

the sum of the numbers marked on the coordinates of any 2×2 inner square matrix in each square matrix is equal to $2(n^2+1)$, and the sum of the numbers marked on the two coordinates whose distance from any diagonal line of each square matrix is $$\frac{n}{2}$$

coordinate units is equal to $n^2+1$, and the side length of the matrix is a coordinate unit that is a multiple of 4.

In some embodiments, n=4.

In some embodiments, step (b) further includes: the positions of numbers marked with the coordinates of the square matrices are the same.

In some embodiments, step (d) further includes: randomly placing the i×j LED dies of the same wavelength segment on the coordinates marked with the same number in the square matrices.

The effect of the present invention is that the LED die mixing method can use the magic square to match the wavelength segment to allocate different types of LED dies 20 (red light, blue light, and green light), so that the following effects can be achieved: 1. the average wavelength between a plurality of LED printed circuit boards is consistent, making the color uniform between a plurality of LED printed circuit boards; 2. the average wavelength of a small area inside a single LED printed circuit board is consistent, making the color of a single LED printed circuit board uniform; 3. the LED dies 20 will not be collided and damaged due to vibration and mixing.

BRIEF DESCRIPTION OF THE DRAWINGS

The present invention will be apparent to those skilled in the art by reading the following detailed description of a preferred embodiment thereof, with reference to the attached drawings, in which:

FIG. 2 is a schematic view of step S10 and step S20 of the first embodiment of the method of the present invention.

FIG. 8 is a schematic view of step S10 and step S20 of the second embodiment of the method of the present invention.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

The implementation of the present invention will be described in more detail below with reference to the drawings and reference symbols, so that those skilled in the art can implement it after studying this specification.

Figure 1:
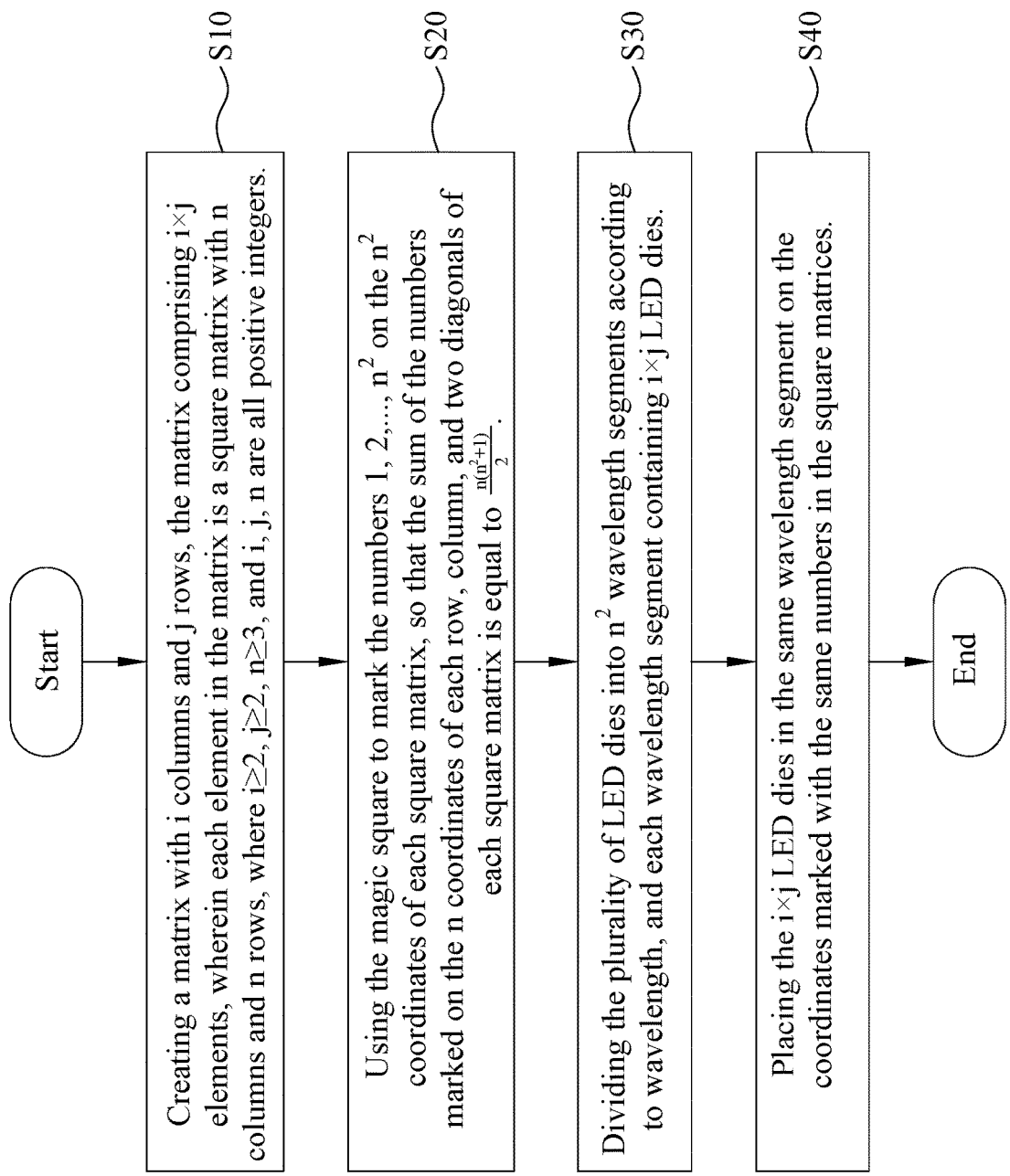
FIG. 1 is a flow chart of the method of the present invention.
Figure 2:
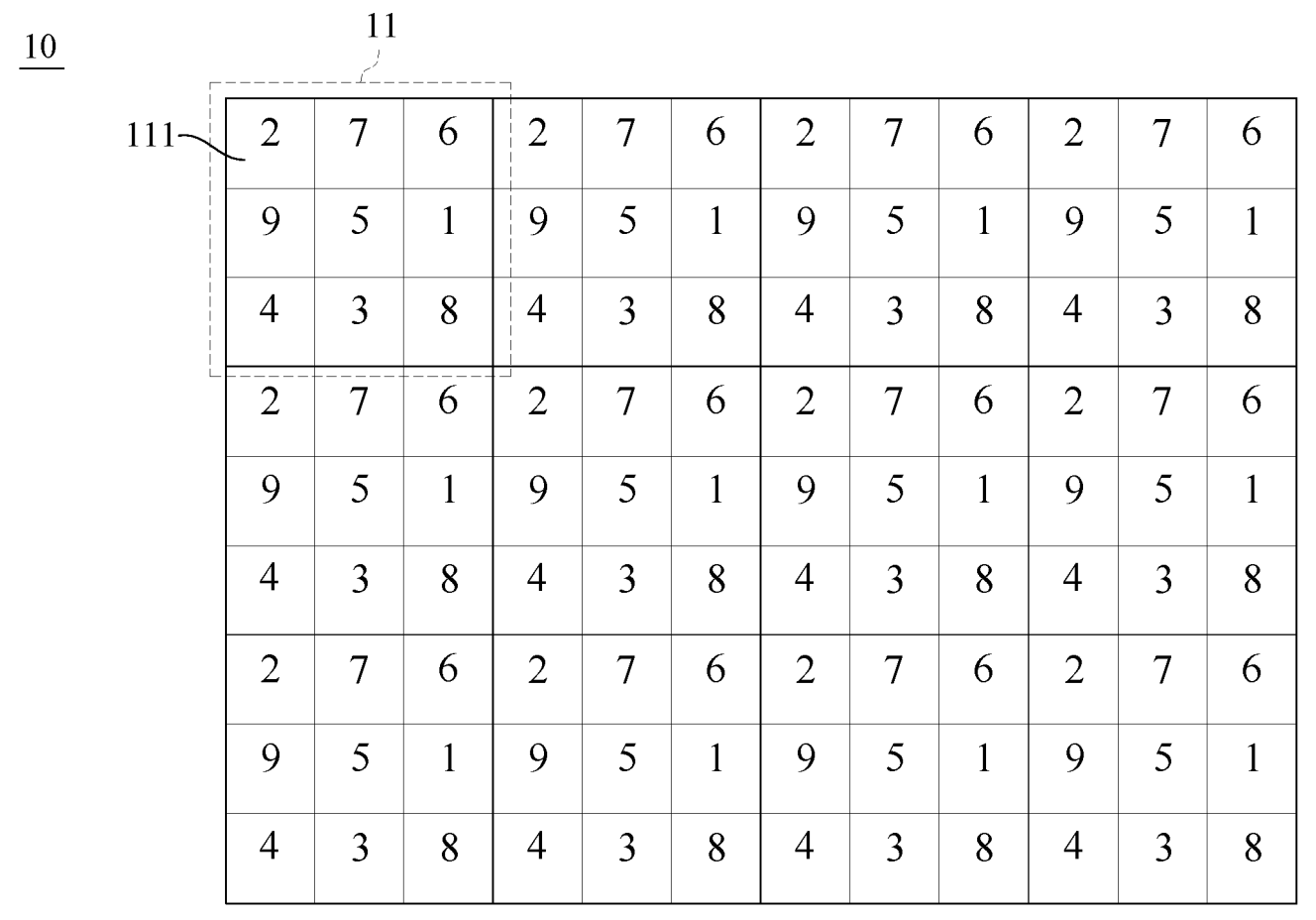
Figure 3:
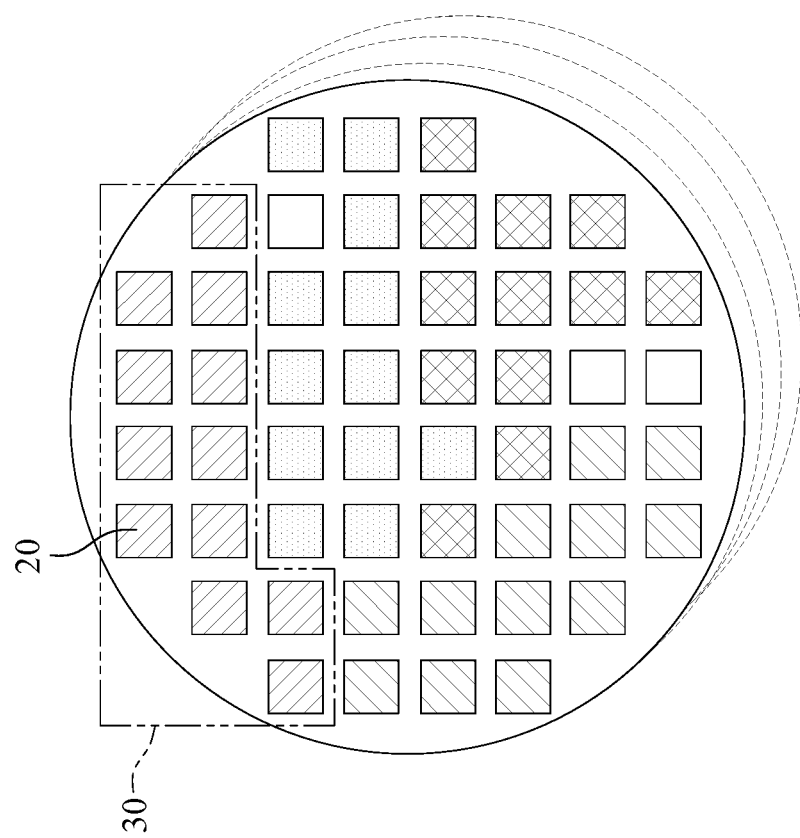
FIG. 3 is a schematic view of step S30 of the first embodiment of the method of the present invention.

FIG. 1 is a flow chart of the method of the present invention. FIG. 2 is a schematic view of step S10 and step S20 of the first embodiment of the method of the present invention. FIG. 3 is a schematic view of step S30 of the first embodiment of the method of the present invention. FIGS. 4-7 are schematic views of step S40 of the first embodiment of the method of the present invention. The invention provides a method for mixing LED dies, comprising the following steps:

Step S10, as shown in FIG. 1 and FIG. 2, establishing a matrix 10 with i columns and j rows, matrix 10 comprising i*j elements, and each element in the matrix 10 having a square matrix 11 with n columns and n rows, where i≥2, j≥2, n≥3, and i, j, n are all positive integers.

Step 20, as shown in FIG. 1 and FIG. 2, using magic square to mark numbers 1, 2, . . . , $n^2$ respectively on the $n^2$ coordinates 111 of each square matrix 11, so that the sum of the numbers marked on the n coordinates 111 of each row, each column, and two diagonals of each square matrix 11 is equal to $$\frac{n(n^2+1)}{2}.$$

Step S30, as shown in FIG. 1 and FIG. 3, dividing a plurality of LED dies 20 into $n^2$ wavelength segments 30 according to wavelength, and each wavelength segment 30 comprising i×j LED dies 20.

Step S40, as shown in FIG. 1, FIG. 4 to FIG. 7, placing the i×j LED dies 20 in the same wavelength segment 30 on the coordinates 111 marked with the same number in the square matrix 11.

In the first embodiment, step S10, as shown in FIG. 2, establishes a matrix 10 with four columns and three rows, the matrix 10 includes twelve elements, and each element in the matrix 10 has a square matrix 11 with three columns and three rows, wherein, i=4, and j=3, the magic square is an odd-order magic square and n=3; step S20, as shown in FIG. 2, uses the magic square numbers 1, 2, . . . , 9 to mark on the nine coordinates 111 of each square matrix 11 respectively, so that the sum of the numbers marked on the three coordinates 111 of each row, each column, and two diagonals of each square matrix 11 is equal to fifteen; step S30, as shown in FIG. 3, divides the plurality of LED dies 20 into nine wavelength segments 30 (only four are shown in the figure) according to the wavelength, and each wavelength segment 30 contains twelve LED dies 20; step S40, as shown in FIG. 4 to FIG. 7, places twelve LED dies 20 in the same wavelength segment 30 respectively on the coordinates 111 marked with the same number in the square arrays 11.

Figure 4:
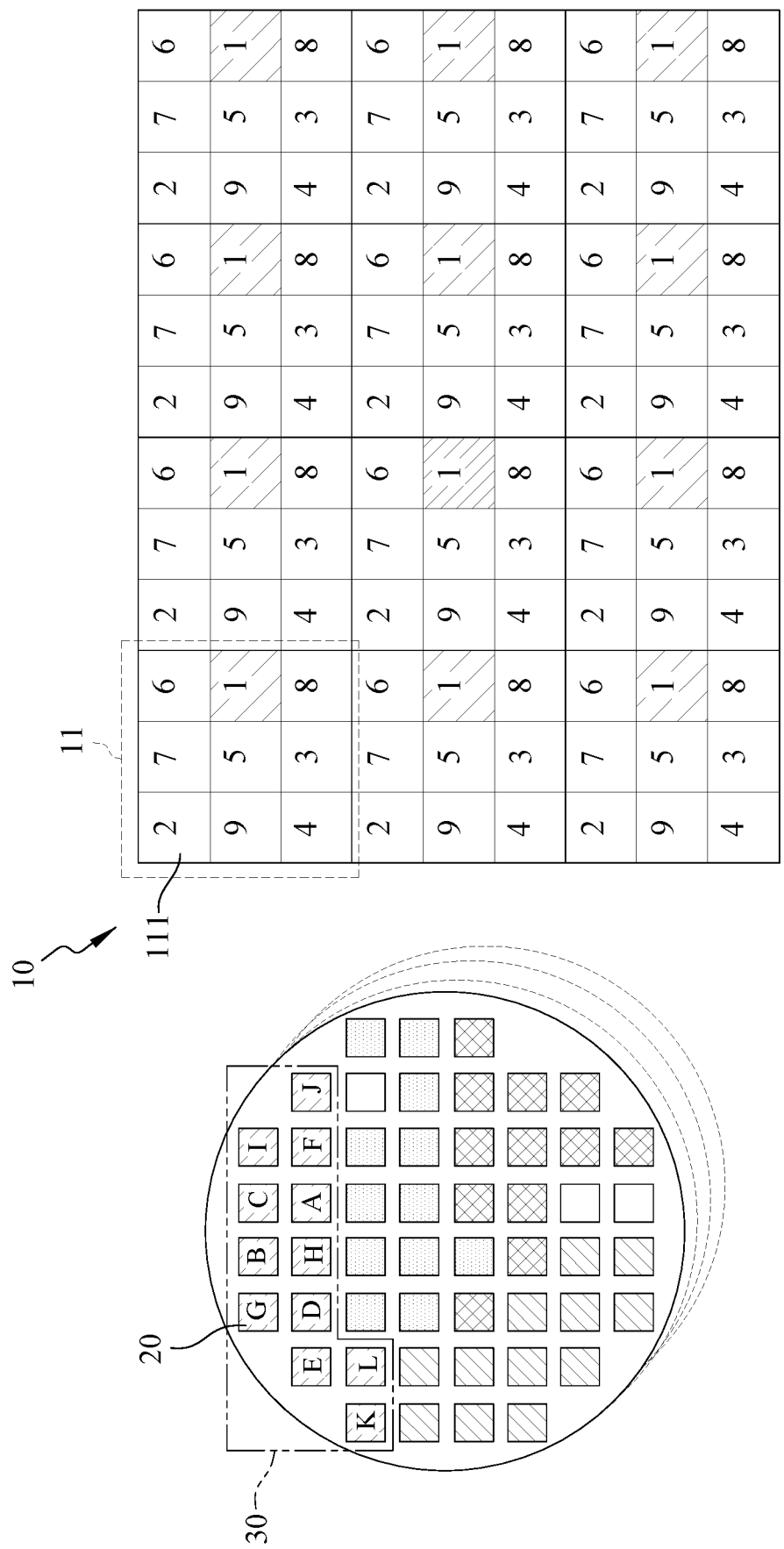
FIGS. 4-7 are schematic views of step S40 of the first embodiment of the method of the present invention.
Figure 5:
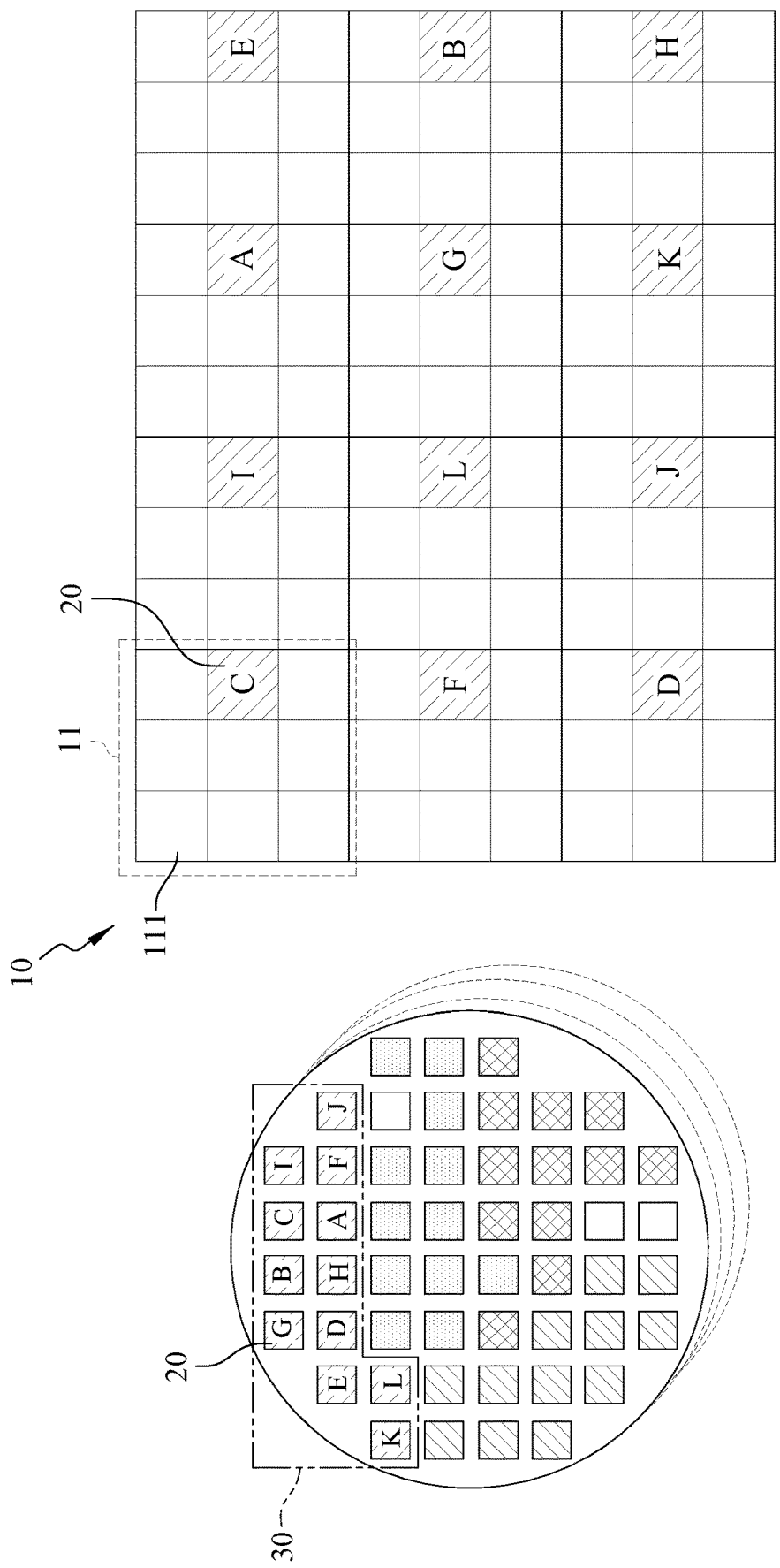
Figure 6:
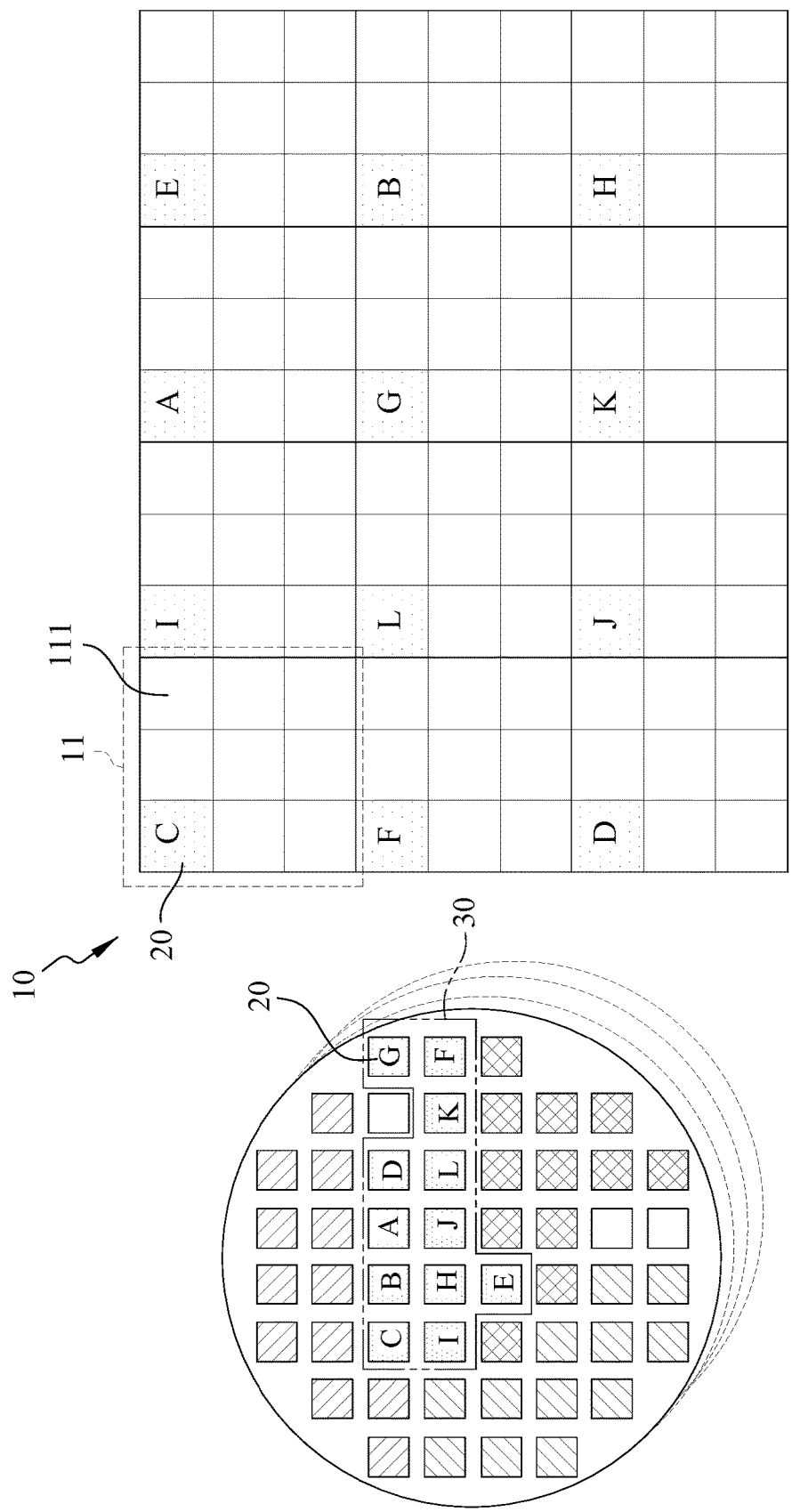
Figure 7:
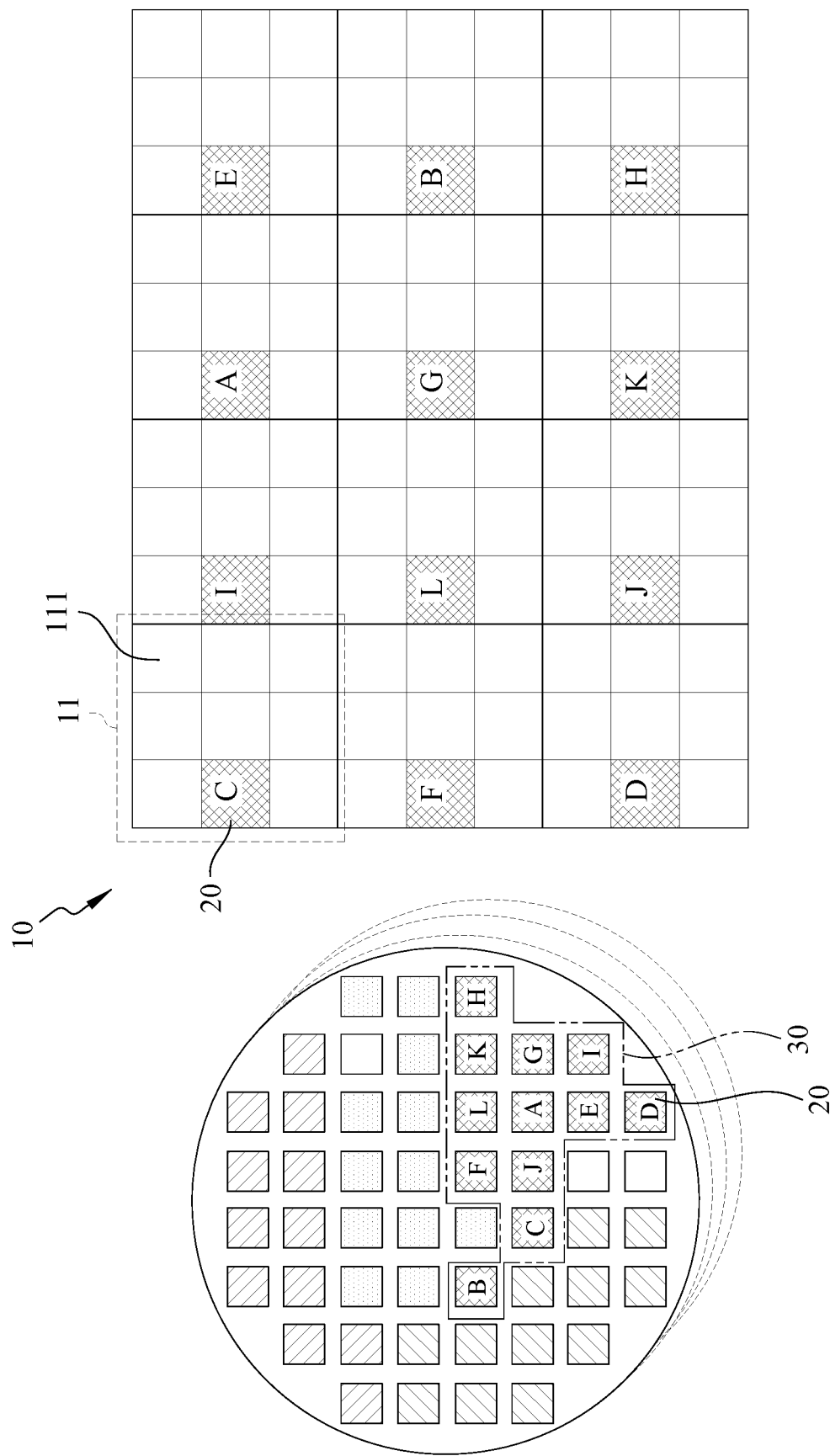

Further, in the first embodiment, FIG. 4 and FIG. 5 show that twelve LED dies 20 (coded as A-L) are respectively placed on the coordinates 111 marked with the number 1 in the square matrix 11. FIG. 6 shows that twelve LED dies 20 (English codes are A-L) are respectively placed on the coordinates 111 with the number 2 in the square matrix 11, and FIG. 7 shows twelve LED dies 20 (English codes are A-L)) are respectively placed on the coordinates 111 marked with number 9 in the square matrix 11, and so on.

Preferably, step S20 further includes: as shown in FIG. 2, the positions of numbers marked by the coordinates 111 of the square matrices 11 are the same. For example, in these square matrices 11, the numbers marked by the coordinates 111 from left to right in the first row are all 2, 7, 6, the numbers marked by the coordinates 111 from left to right in the second row are all 9, 5, 1, and the numbers marked by the coordinate 111 from left to right in the third row are all 4, 3, 8, and so on.

Preferably, step S40 further includes: as shown in FIG. 4 and FIG. 5, randomly placing twelve LED dies 20 in the same wavelength range 30 on the coordinates 111 marked with the same number in the square arrays 11. For example, twelve LED dies 20 (coded as A-L) of the same wavelength segment 30 are randomly placed on the coordinates 111 marked with number 1 in the square matrices 11.

Figure 8:
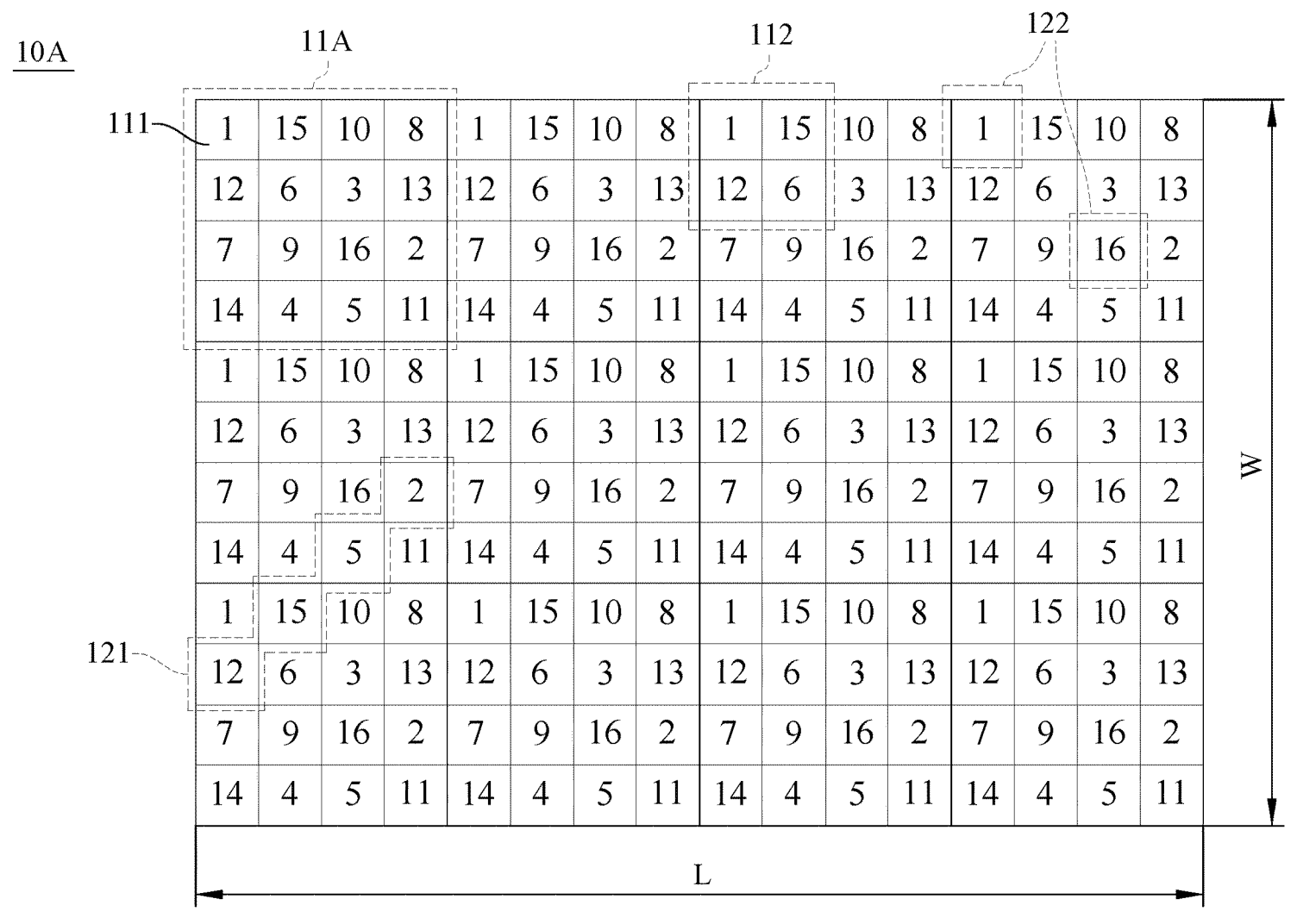
Figure 9:
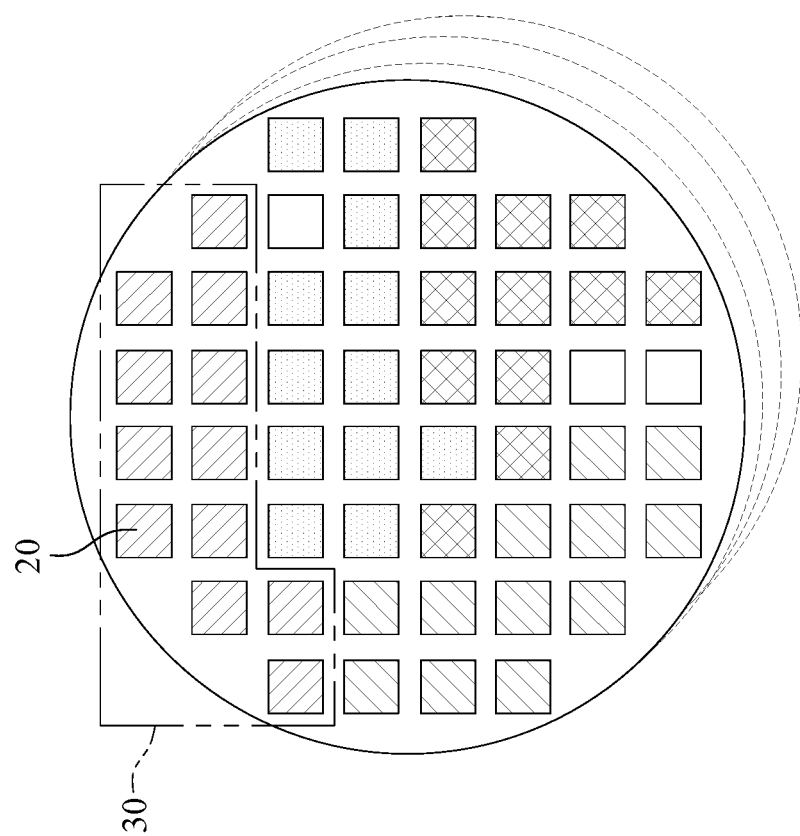
FIG. 9 is a schematic view of step S30 of the second embodiment of the method of the present invention.

FIG. 8 is a schematic view of step S10 and step S20 of the second embodiment of the method of the present invention. FIG. 9 is a schematic view of step S30 of the second embodiment of the method of the present invention. FIGS. 10-13 are schematic views of step S40 of the second embodiment of the method of the present invention. The difference between the second embodiment and the first embodiment is that step S10 further includes: the magic square is an even-order magic square; step S20 further includes: the sum of the numbers marked on n continuous coordinates 111 of any diagonal 121 of two adjacent square matrices 11A is equal to $$\frac{n(n^2+1)}{2},$$

and the sum of the numbers marked on the coordinates 111 of any 2×2 inner square matrix 112 in each matrix 11A is equal to $2(n^2+1)$, the sum of the numbers marked on the two coordinates 111 of $$\frac{n}{2}$$

coordinate unit of the distance from any diagonal 122 in each matrix 11A is equals n²+1, and the matrix 10A whose side lengths, L and W, are both multiples of 4 coordinate units.

In the second embodiment, step S10, as shown in FIG. 8, establishes a matrix 10A with four columns and three rows, the matrix 10A includes twelve elements, and each element in the matrix 10A has a square matrix 11A with four columns and four rows, wherein, i=4, and j=3, the magic square is even-order magic square and n=4; Step S20, as shown in FIG. 8, uses magic square numbers 1, 2, . . . , 16 to mark on the twelve coordinates 111 in each square matrix 11A respectively, so that the sum of the numbers marked on the four coordinates 111 of each row, each column, and two diagonal lines of each square matrix 11A is equal to thirty-four. The sum of the numbers marked on any diagonal 121 of two adjacent square matrices 11A on four consecutive coordinates 111 is equal to thirty-four. The sum of the numbers marked on the coordinates 111 of any 2×2 inner square matrix 112 in each square matrix 11A is equal to thirty-four. The sum of the numbers marked on the two coordinates 111 of two coordinate units of the distance from any diagonal 122 in each matrix 11A is equals 17, and the matrix 10A whose long side length L is sixteen coordinate units and the short side length W is twelve coordinate units. Step S30, as shown in FIG. 9, divides the plurality of LED dies 20 into sixteen wavelength segments 30 (only four are shown in the figure) according to the wavelength, and each wavelength segment 30 contains twelve LED dies 20. Step S40, as shown in FIGS. 10-13, twelve dies 20 of the same wavelength segment 30 are respectively placed on the coordinates 111 marked with the same numbers in the square arrays 11A.

Figure 10:
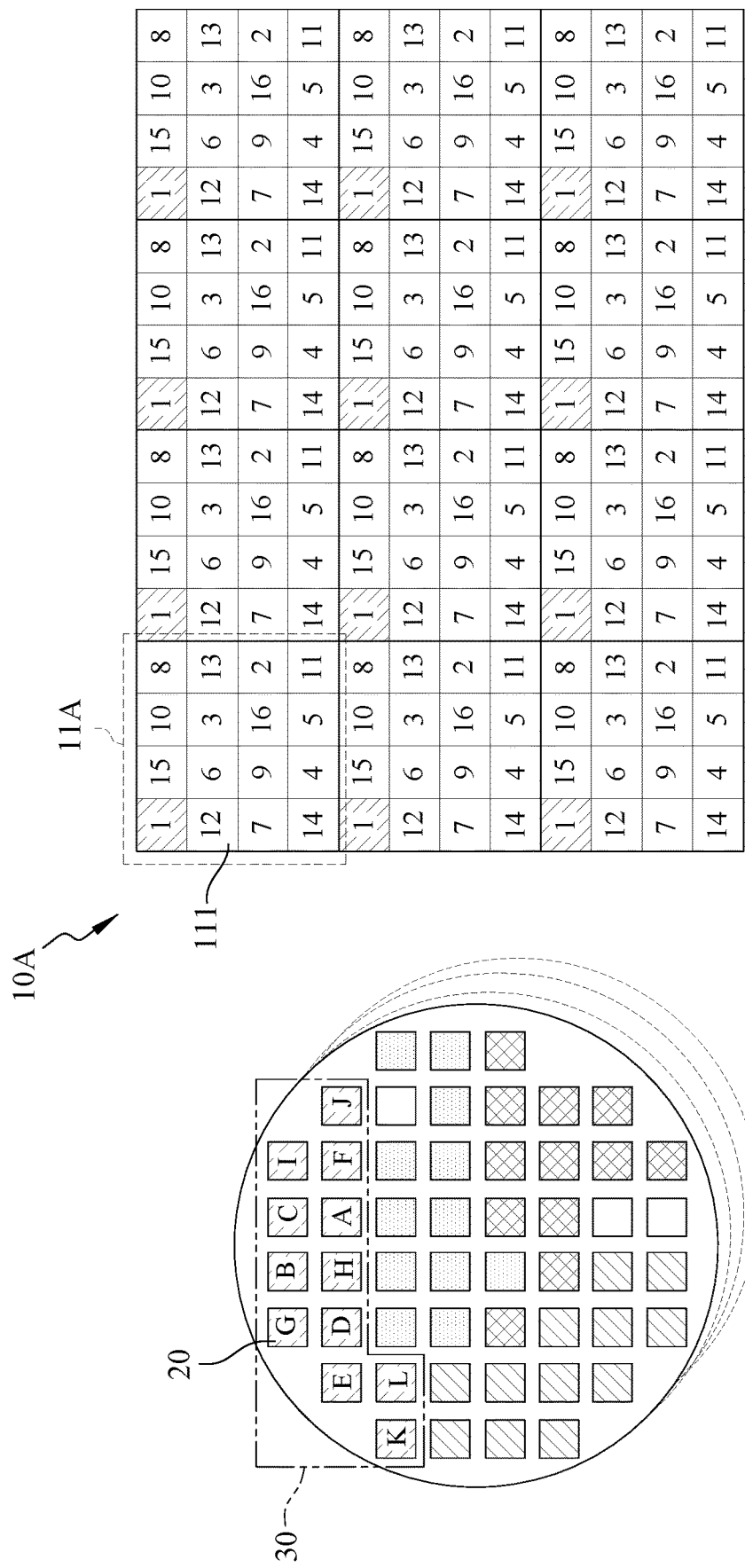
FIGS. 10-13 are schematic views of step S40 of the first embodiment of the method of the present invention.
Figure 11:
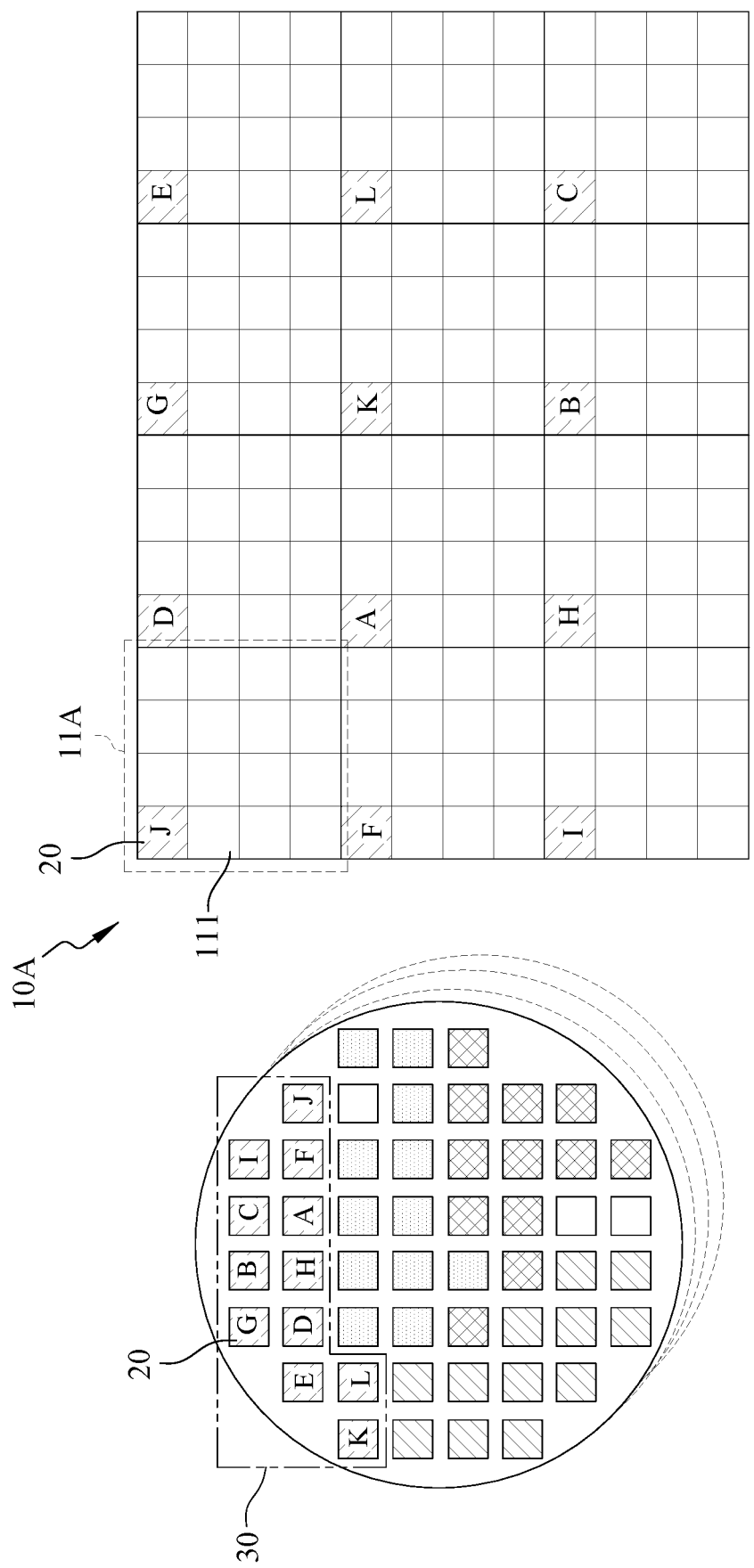
Figure 12:
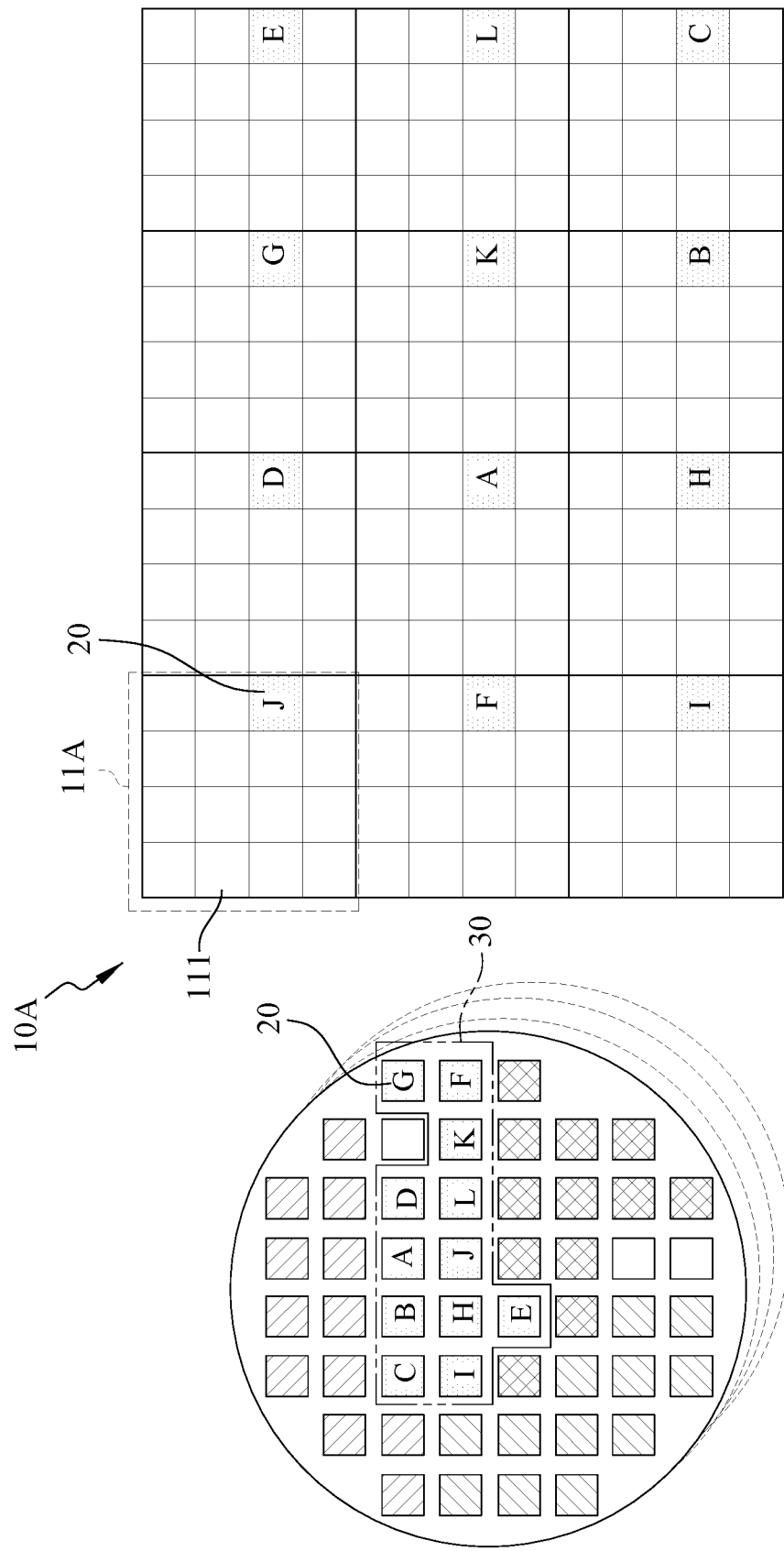
Figure 13:
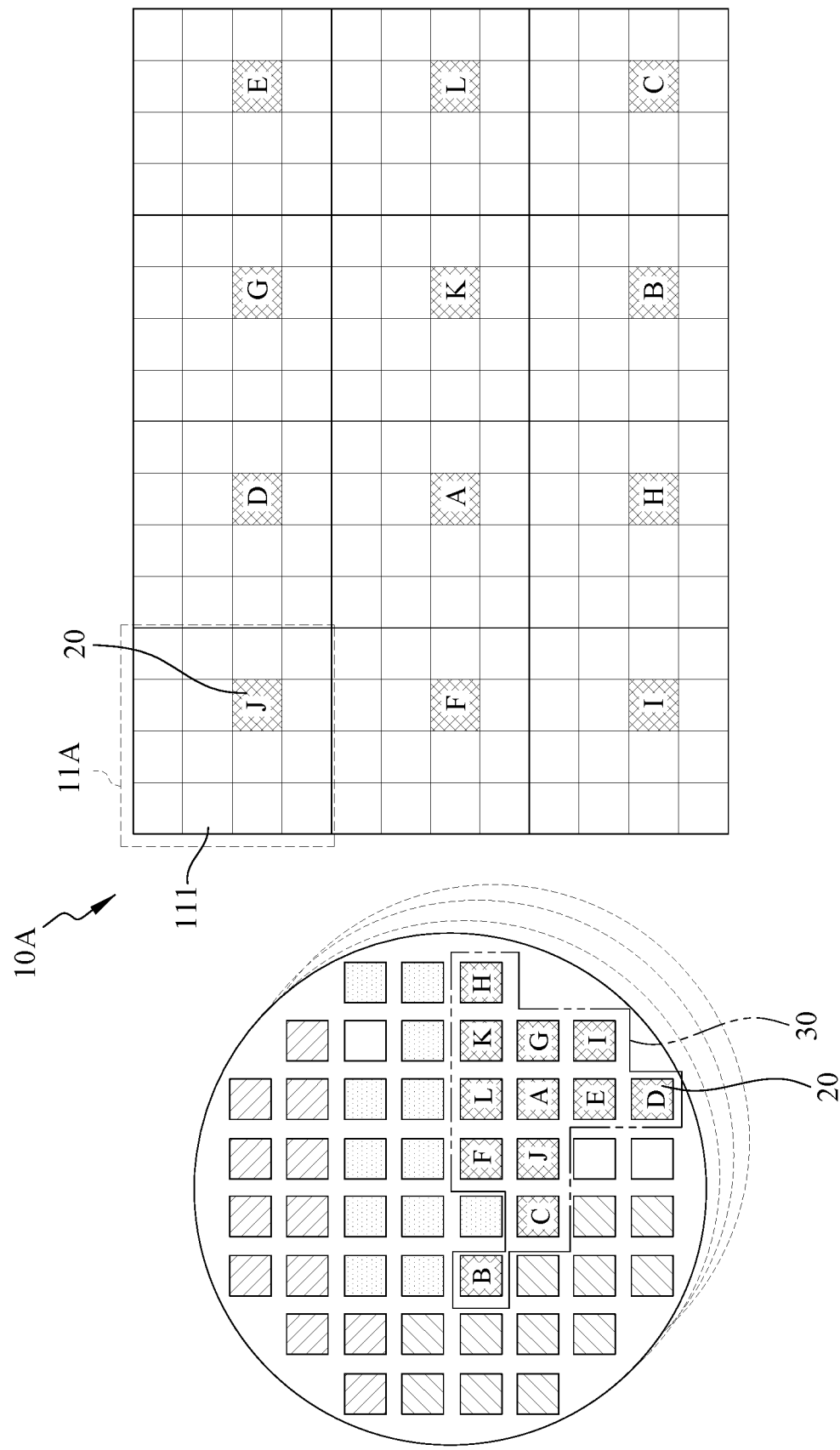

Furthermore, in the second embodiment, FIG. 10 and FIG. 11 show that twelve LED dies 20 (English codes are A-L) are respectively placed on the coordinates 111 marked with the number 1 in the square matrix 11A. FIG. 12 shows that twelve LED dies 20 (coded are A-L) are respectively placed on the coordinates 111 of the number 2 in the square matrix 11A. FIG. 13 shows that twelve LED dies 20 (coded are A-L)) are respectively placed on the coordinates 111 marked with number 16 in the square matrix 11A, and so on.

Preferably, step S20 further includes: as shown in FIG. 8, the positions of numbers marked with the coordinates 111 of the square matrices 11A are the same. For example, in these square matrices 11A, the numbers marked by the coordinates 111 from left to right in the first row are all 1, 15, 10, 8, and the numbers marked by the coordinates 111 from left to right in the second row are all 12, 6, 3, 13, the numbers marked by the coordinates 111 from left to right in the third row are all 7, 9, 16, 2, and the numbers marked by the coordinates 111 from left to right in the fourth line are 14, 4, 5, 11, and so on.

Preferably, step S40 further includes: as shown in FIG. 10 and FIG. 11, randomly placing twelve LED dies 20 in the same wavelength segment 30 on the coordinates 111 marked with the same number in the square matrices 11A. For example, twelve LED dies 20 (coded as A-L) of the same wavelength segment 30 are randomly placed on the coordinates 111 marked with number 1 in the square matrices 11A.

It is worth mentioning that each square matrix 11 is a single LED printed circuit board, the matrix 10 is an LED light box, and a plurality of light boxes is an LED display screen.

In summary, the method for mixing LED dies of the present invention can use the magic square to match the wavelength segment to allocate different types of LED dies 20 (red light, blue light, and green light), so that the following effects can be achieved: First, the average wavelength between a plurality of LED printed circuit boards is consistent, making the color uniform among a plurality of LED printed circuit boards; second, the average wavelength of a small area inside a single LED printed circuit board is consistent, making a single LED printed circuit board uniform in color; third, the LED dies 20 will not be collided and damaged due to vibration and mixing.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for mixing LED dies, comprising the following steps:
   (a) creating a matrix with i columns and j rows, the matrix comprising i×j elements, wherein each element in the matrix is a square matrix with n columns and n rows, where i≥2, j≥2, n≥3, and i, j, n are all positive integers;
   (b) using the magic square to mark the numbers 1, 2, . . . , n² on the n² coordinates of each square matrix, so that the sum of the numbers marked on the n coordinates of each row, column, and two diagonals of each square matrix is equal to $$\frac{n(n^2+1)}{2};$$

(c) dividing the plurality of LED dies into n² wavelength segments according to wavelength, and each wavelength segment containing i×j LED dies; and
   (d) placing the i×j LED dies in the same wavelength segment on the coordinates marked with the same numbers in the square matrices.

2. The method for mixing LED dies according to claim 1, wherein step (b) further comprises: the positions of numbers marked with the coordinates of the square matrices are the same.

3. The method for mixing LED dies according to claim 1, wherein step (d) further comprises: randomly placing the i×j LED dies of the same wavelength segment on the coordinates marked with the same number in the square matrices.

4. The method for mixing LED dies according to claim 1, wherein the magic square is an odd-order magic square.

5. The method for mixing LED dies according to claim 4, wherein n=3.

6. The method for mixing LED dies according to claim 1, wherein the magic square is an even-order magic square.

7. The method for mixing LED dies according to claim 6, wherein step (b) further comprises: the sum of numbers marked on the n consecutive coordinates on any diagonal line of two adjacent square matrices is equal to $$\frac{n(n^2+1)}{2}.$$

8. The method for mixing LED dies according to claim 6, wherein step (b) further comprises: the sum of the numbers marked on the coordinates of any 2×2 inner square matrix in each square matrix is equal to 2(n²+1), and the sum of the numbers marked on the two coordinates whose distance from any diagonal line of each square matrix is $$\frac{n}{2}$$

coordinate units is equal to n²+1, and the side length of the matrix is a coordinate unit that is a multiple of 4.

9. The method for mixing LED dies according to claim 6, wherein step (b) further comprises: the sum of numbers marked on the n consecutive coordinates on any diagonal line of two adjacent square matrices is equal to $$\frac{n(n^2+1)}{2},$$

the sum of the numbers marked on the coordinates of any 2×2 inner square matrix in each square matrix is equal to $2(n^2+1)$, and the sum of the numbers marked on the two coordinates whose distance from any diagonal line of each square matrix is $$\frac{n}{2}$$

coordinate units is equal to $n^2+1$, and the side length of the matrix is a coordinate unit that is a multiple of 4.

10. The method for mixing LED dies according to claim 6, wherein n=4.

\* \* \* \* \*